US011955372B2

(12) United States Patent
Nakai et al.

(10) Patent No.: US 11,955,372 B2
(45) Date of Patent: Apr. 9, 2024

(54) SEMICONDUCTOR STORAGE DEVICE

(71) Applicant: Kioxia Corporation, Tokyo (JP)

(72) Inventors: Takehiro Nakai, Yokkaichi Mie (JP); Mizuki Tamura, Nagoya Aichi (JP); Yumiko Yamashita, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 192 days.

(21) Appl. No.: 17/407,576

(22) Filed: Aug. 20, 2021

(65) Prior Publication Data

US 2022/0148910 A1 May 12, 2022

(30) Foreign Application Priority Data

Nov. 6, 2020 (JP) .................................. 2020-185963

(51) Int. Cl.
*H01L 21/762* (2006.01)
*H01L 27/02* (2006.01)
*H10B 41/35* (2023.01)
*H10B 43/35* (2023.01)

(52) U.S. Cl.
CPC .. *H01L 21/76237* (2013.01); *H01L 21/76232* (2013.01); *H10B 41/35* (2023.02); *H10B 43/35* (2023.02); *H01L 27/0207* (2013.01)

(58) Field of Classification Search
CPC .................. H01L 21/76; H01L 21/762; H01L 29/0619–0623; H01L 21/76224–76237; H01L 21/823481; H01L 21/823878; H10B 41/35; H10B 41/41
See application file for complete search history.

(56) References Cited

U.S. PATENT DOCUMENTS

| 5,739,575 | A | 4/1998 | Numano et al. |
| 6,885,080 | B2 | 4/2005 | Chen et al. |
| 6,949,775 | B1 | 9/2005 | Takada |
| 8,241,999 | B2 | 8/2012 | Ikeda et al. |
| 9,704,909 | B2 | 7/2017 | Kaneda |
| 2004/0183139 | A1* | 9/2004 | Kim ........................ H10B 41/44 257/374 |
| 2006/0035447 | A1 | 2/2006 | Ikeda et al. |
| 2008/0237784 | A1 | 10/2008 | Miyamoto et al. |
| 2011/0220996 | A1 | 9/2011 | Kutsukake et al. |

(Continued)

FOREIGN PATENT DOCUMENTS

| JP | H07-297174 A | 11/1995 |
| JP | H09-069609 A | 3/1997 |

(Continued)

OTHER PUBLICATIONS

Notice of Allowance on U.S. Appl. No. 16/937,825 dated Aug. 30, 2022.

*Primary Examiner* — Amar Movva
*Assistant Examiner* — Stanetta D Isaac
(74) *Attorney, Agent, or Firm* — Foley & Lardner LLP

(57) ABSTRACT

A semiconductor storage device includes: a semiconductor substrate; a plurality of circuit regions; and an element isolation region having a trench shape formed between the circuit regions. In the element isolation region including a thermal oxide film and a silicon oxide film, a sub-trench is formed in a bottom corner portion, and the thermal oxide film covers at least an inner wall of the sub-trench.

17 Claims, 9 Drawing Sheets

(56) References Cited

U.S. PATENT DOCUMENTS

| | | |
|---|---|---|
| 2012/0083066 A1 | 4/2012 | Kim |
| 2017/0040335 A1 | 2/2017 | Lim et al. |
| 2020/0020734 A1 | 1/2020 | Wang et al. |
| 2021/0082908 A1 | 3/2021 | Nakai |

FOREIGN PATENT DOCUMENTS

| | | |
|---|---|---|
| JP | H969609 A | 3/1997 |
| JP | H10-022262 A | 1/1998 |
| JP | 2001-332559 A | 11/2001 |
| JP | 2006-080481 A | 3/2006 |
| JP | 2006-303073 A | 11/2006 |
| JP | 2008-258265 A | 10/2008 |
| JP | 2009-224585 A | 10/2009 |
| JP | 2021-044433 A | 3/2021 |

* cited by examiner

FIG. 3
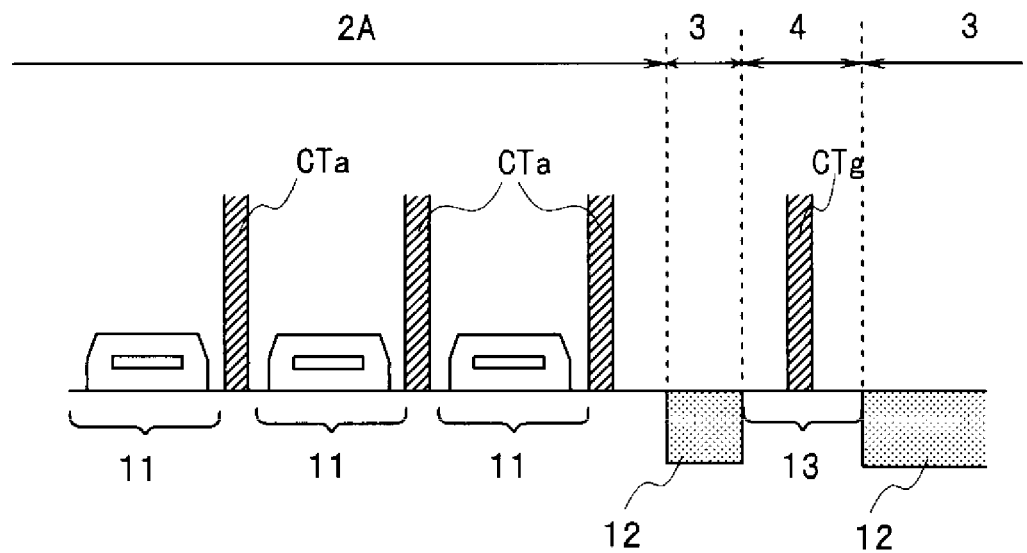
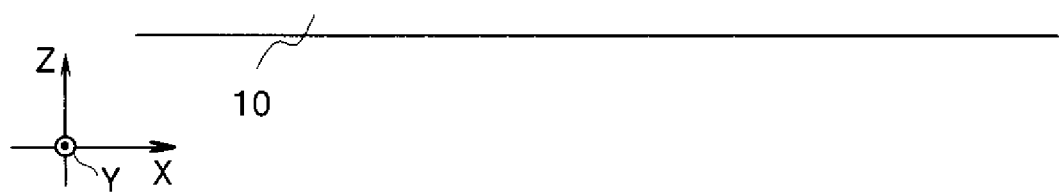
FIG. 4
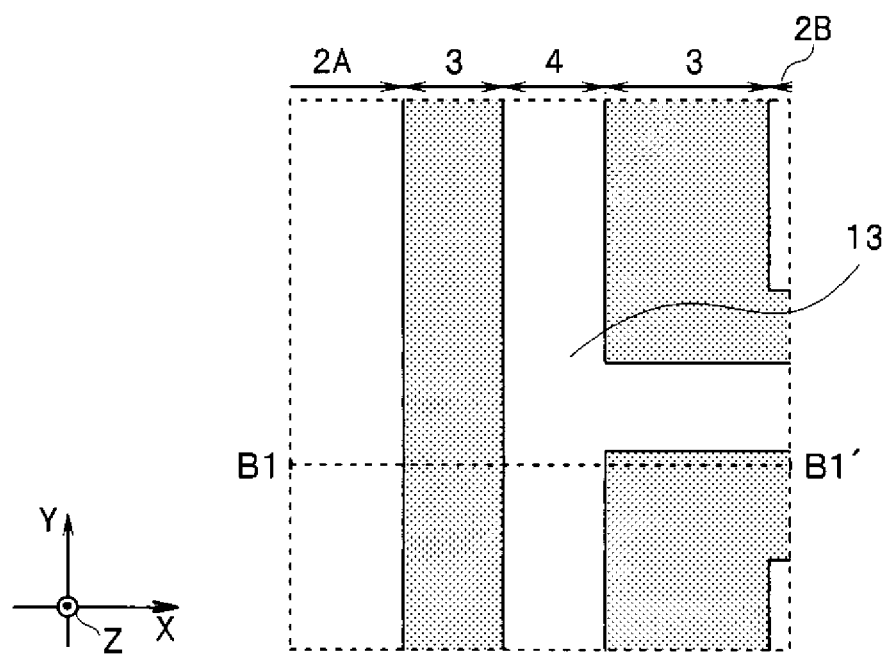

SEMICONDUCTOR STORAGE DEVICE

CROSS-REFERENCE TO RELATED APPLICATION(S)

This application is based upon and claims the benefit of priority from Japanese Patent Application No. 2020-185963, filed Nov. 6, 2020, the entire contents of which are incorporated herein by reference.

FIELD

Embodiments described herein relate generally to a semiconductor storage device.

BACKGROUND

A semiconductor storage device having a structure in which a guard ring surrounds a periphery of an element forming region is known.

DESCRIPTION OF THE DRAWINGS

FIG. 3 is a cross-sectional view showing a configuration example of a semiconductor storage device according to a comparative example.

FIG. 4 is a plan view illustrating a comparison layout of guard ring lines disposed in a guard ring region.

DETAILED DESCRIPTION

At least one embodiment provides a semiconductor storage device capable of preventing crystal defects generated from a guard ring as a starting point from extending to an element forming region.

In general, according to at least one embodiment, a semiconductor storage device includes: a semiconductor substrate; a plurality of circuit regions formed in the semiconductor substrate; and an element isolation region formed between one of the plurality of circuit regions and another of the plurality of circuit regions. The element isolation region has a trench shape in which a sub-trench is formed in a bottom corner portion of the element isolation region. The element isolation region includes a first insulating film and a second insulating film. Further, the first insulating film covers at least an inner wall of the sub-trench.

Hereinafter, embodiments will be described with reference to the drawings.

Figure 1:
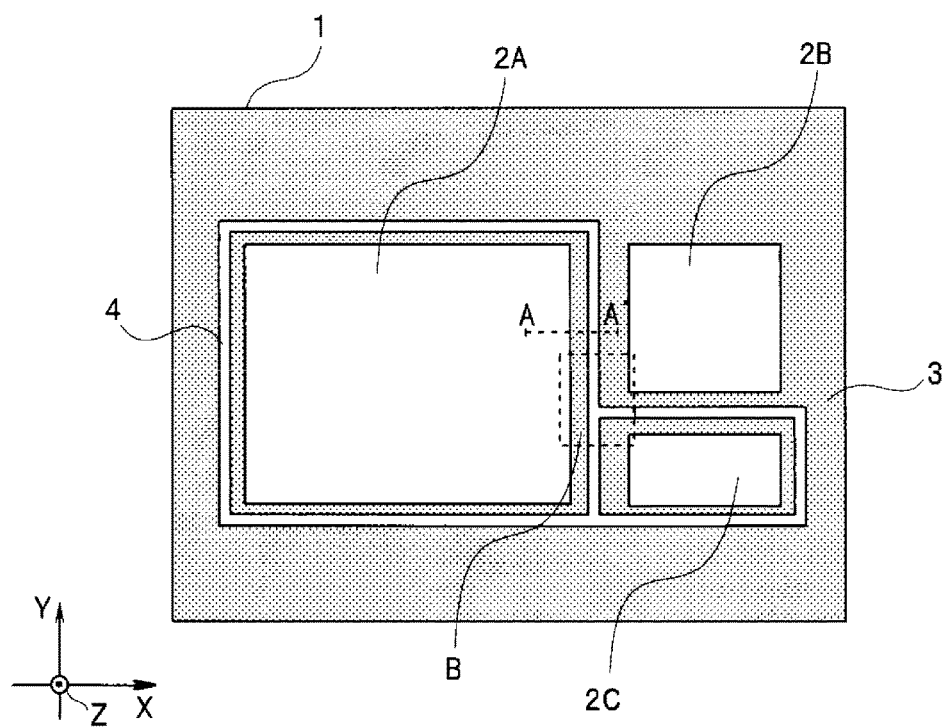
FIG. 1 is a plan view showing a configuration example of a semiconductor storage device according to at least one embodiment.
Figure 2:
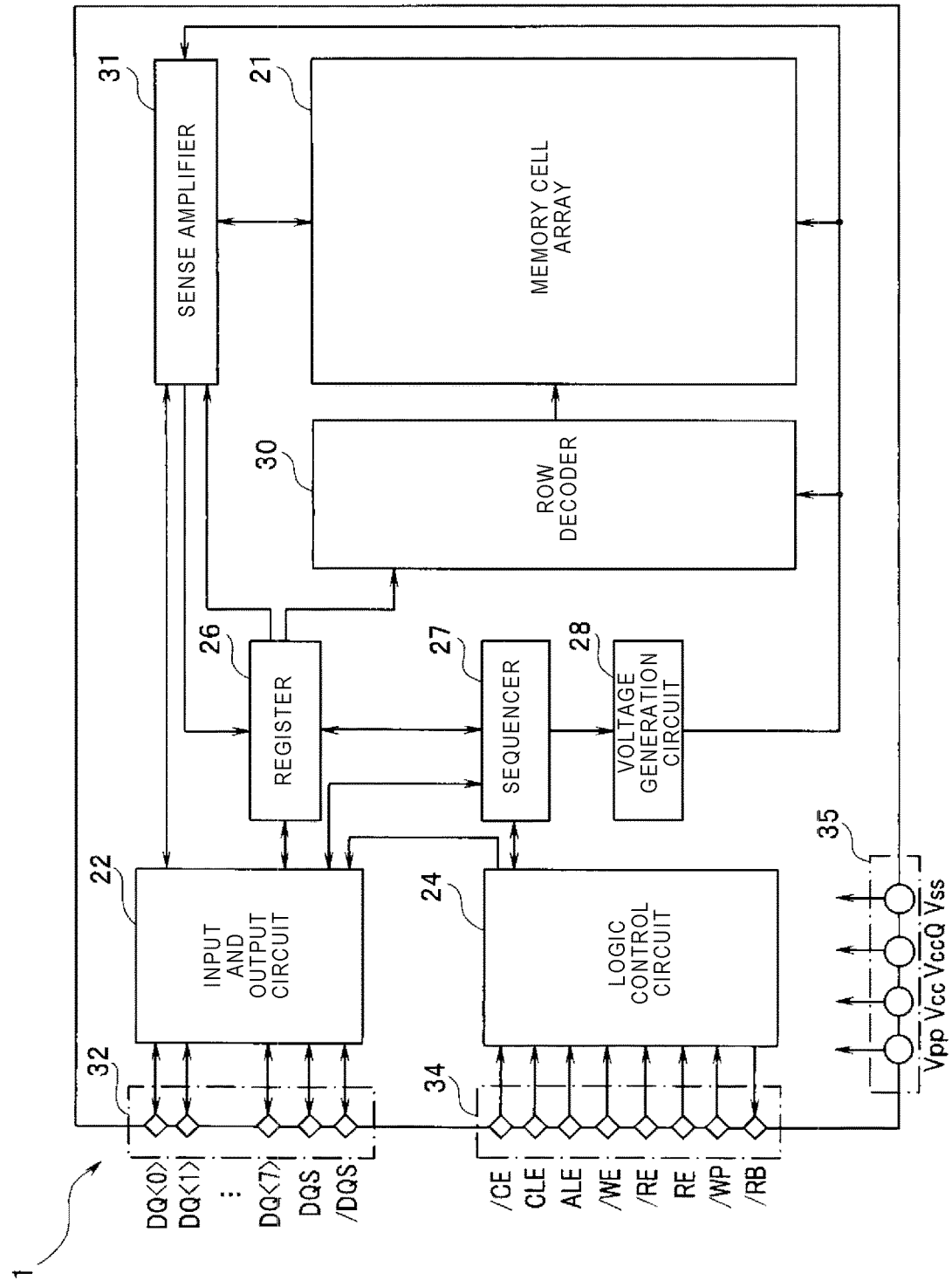
FIG. 2 is a block diagram showing a configuration example of the semiconductor storage device according to at least one embodiment.

FIG. 1 is a plan view showing a configuration example of a semiconductor storage device according to at least one embodiment. FIG. 2 is a block diagram showing a configuration example of the semiconductor storage device according to at least one embodiment. FIG. 3 is a cross-sectional view showing a configuration example of a semiconductor storage device of a comparative example, and is a cross-sectional view taken along a line A-A' of the semiconductor storage device shown in FIG. 1. FIG. 1 is a plan view of a part of a semiconductor storage device 1 including a guard ring region 4. The semiconductor storage device 1 of the embodiment is, for example, a nonvolatile memory including a NAND memory (NAND flash memory), and is formed as a semiconductor chip. A surface of a semiconductor substrate 10 of the semiconductor storage device 1 is parallel to an XY plane extending in an X direction and a Y direction. Further, the semiconductor storage device 1 has a rectangular shape including end sides along the X direction and the Y direction when viewed from a Z direction perpendicular to the XY plane. The X direction, the Y direction, and the Z direction are orthogonal to one another.

As shown in FIG. 1, a first circuit region 2A, a second circuit region 2B, and a third circuit region 2C are formed in the semiconductor storage device 1. Each of the first circuit region 2A, the second circuit region 2B, and the third circuit region 2C functions as, for example, an element forming region. The guard ring region 4 surrounds the first circuit region 2A and the third circuit region 2C. In the first circuit region 2A and the second circuit region 2B, peripheral circuits constituting the semiconductor storage device 1 are formed in units of functional blocks.

As shown in FIG. 2, the semiconductor storage device 1 of the present embodiment includes, for example, a memory cell array 21, an input and output circuit 22, a logic control circuit 24, a register 26, a sequencer 27, a voltage generation circuit 28, a row decoder 30, a sense amplifier 31, an input and output pad group 32, a logic control pad group 34, and a power supply input terminal group 35.

The memory cell array 21 includes a plurality of nonvolatile memory cells (not shown) associated with word lines and bit lines.

The input and output circuit 22 transmits and receives signals DQ <7:0> and data strobe signals DQS and /DQS to and from a memory controller 1. The input and output circuit 22 transfers a command and an address in the signals DQ <7:0> to the register 26. The input and output circuit 22 transmits and receives write data and read data to and from the sense amplifier 31.

The logic control circuit 24 receives a chip enable signal /CE, a command latch enable signal CLE, an address latch enable signal ALE, a write enable signal /WE, read enable signals RE, /RE, and a write protect signal /WP from the memory controller 1. Further, the logic control circuit 24 transfers a ready busy signal /RB to the memory controller 1, and notifies the outside of a state of the nonvolatile memory 2.

The voltage generation circuit 28 generates voltages necessary for operations such as writing, reading, and erasing of data based on an instruction from the sequencer 27.

The row decoder 30 receives a block address and a row address in the address from the register 26, selects a corresponding block based on the block address, and selects a corresponding word line based on the row address.

When the data is read, the sense amplifier 31 senses the read data read from a memory cell to the bit line, and transfers the sensed read data to the input and output circuit 22. When the data is written, the sense amplifier 31 transfers the write data written via the bit line to the memory cell.

The input and output pad group 32 includes a plurality of terminals (pads) corresponding to the signals DQ <7:0> and the data strobe signals DQS and /DQS in order to transmit and receive signals including the data to and from the memory controller 1.

The logic control pad group 34 includes a plurality of terminals (pads) corresponding to the chip enable signal /CE, the command latch enable signal CLE, the address latch enable signal ALE, the write enable signal /WE, the read enable signals RE, /RE, and the write protect signal /WP in order to transmit and receive the signals to and from the memory controller 1.

The power supply input terminal group 35 includes a plurality of terminals to which power supply voltages Vcc, VccQ, and Vpp and a ground voltage Vss are input in order to supply various operation power supplies from the outside to the nonvolatile memory 2. The power supply voltage Vcc is a circuit power supply voltage which is generally externally supplied as the operation power supply, and a voltage of, for example, about 3.3 V is input. For example, a voltage of 1.2 V is input to the power supply voltage VccQ. The power supply voltage VccQ is used to transmit and receive the signals between the memory controller 1 and the nonvolatile memory 2. The power supply voltage Vpp is a power supply voltage higher than the power supply voltage Vcc, and a voltage of, for example, 12 V is input to the power supply voltage Vpp. When the data is written to the memory cell array 21 or the data is erased, a high voltage of about 20 V is required. At this time, boosting the power supply voltage Vpp of about 12 V can generate a desired voltage with a high speed and low power consumption than boosting the power supply voltage Vcc of about 3.3 V by a booster circuit of the voltage generation circuit 28. On the other hand, for example, when the nonvolatile memory 2 is used in an environment where a high voltage cannot be supplied, a voltage may not be supplied to the power supply voltage Vpp. Even when the power supply voltage Vpp is not supplied, the nonvolatile memory 2 can perform various operations as long as the power supply voltage Vcc is supplied. That is, the power supply voltage Vcc is a power supply that is supplied to the nonvolatile memory 2 in a standard manner, and the power supply voltage Vpp is a power supply that is additionally and optionally supplied according to, for example, a usage environment.

FIG. 1 schematically shows only portions corresponding to the first circuit region 2A, the second circuit region 2B, and the third circuit region 2C among a plurality of circuit regions in the semiconductor storage device 1. For example, a circuit constituting a sense amplifier unit (a part of the sense amplifier 31) of the sense amplifier 31 is formed in the first circuit region 2A, a circuit constituting the sequencer 27 is formed in the second circuit region 2B, and a circuit constituting a data register (another part of the sense amplifier 31) of the sense amplifier 31 is formed in the third circuit region 2C. Other examples formed in the first circuit region 2A, the second circuit region 2B, and the third circuit region 2C in units of the functional blocks are not limited to those described above. For example, any one of the row decoder 30, the register 26, the voltage generation circuit 28, the logic control circuit 24, and the memory cell array 21 may be formed in units of the functional blocks in the first circuit region 2A, the second circuit region 2B, or the third circuit region 2C.

The guard ring region 4 electrically disconnects adjacent circuit regions (for example, the second circuit region 2B or the third circuit region 2C) from the first circuit region 2A, and prevents electrical interference from an external circuit to a circuit formed in the first circuit region 2A. Further, the guard ring region 4 electrically disconnects adjacent circuit regions (for example, the first circuit region 2A or the second circuit region 2B) from the third circuit region 2C, and prevents electrical interference from the external circuit to a circuit formed in the third circuit region 2C. In the semiconductor storage device 1 of at least one present embodiment, the guard ring region 4 is formed in a circuit isolation region 3 so as to continuously surround a periphery of the first circuit region 2A in the XY plane. The guard ring region 4 is formed in the circuit isolation region 3 so as to continuously surround a periphery of the third circuit region 2C in the XY plane. That is, the guard ring region 4 has a rectangular shape in the XY plane. In the XY plane, when one side in the X direction is defined as "right", the other side in the X direction is defined as "left", one side in the Y direction is defined as "upper", and the other side in the Y direction is defined as "lower", the guard ring region 4 is formed at a position corresponding to right, the left, the upper and the lower parts of the first circuit region 2A and the third circuit region 2C in the circuit isolation region 3.

The shape of the guard ring region 4 is not limited to the rectangular shape. For example, the guard ring region 4 may have an angular-U shape in the XY plane. In this case, the guard ring region 4 does not completely surround the periphery of the first circuit region 2A and the third circuit region 2C. For example, among sides extending in the Y direction in the first circuit region 2A, a portion extending in the Y direction on a left side of a side far from the second circuit region 2B or the third circuit region 2C may be omitted. That is, an arrangement place or a planar shape of the guard ring region 4 is designed in consideration of a relative positional relationship between a circuit region (for example, the first circuit region 2A) in which the electrical interference with the external circuit is desired to be prevented and other adjacent circuit regions (for example, the second circuit region 2B and the third circuit region 2C), an electrical characteristic (for example, an allowable noise level), or the like.

As shown in FIG. 3, in the semiconductor substrate 10, the guard ring region 4 is formed on a right side (one side) in the X direction of the first circuit region 2A via the circuit isolation region 3. The circuit isolation region 3 is also formed on a right side (the other side) of the guard ring region 4 in the X direction. That is, the guard ring region 4 has a structure sandwiched between the circuit isolation regions 3.

A plurality of transistors 11 are formed in the first circuit region 2A. A predetermined potential is supplied to a source and drain of the transistors 11 from an upper wiring layer (not shown) via contact electrodes CTa.

In the circuit isolation regions 3, for example, shallow trench isolation (STI) is formed as the element isolation regions 12. The STI has a configuration in which a silicon oxide film as an insulator is embedded in a groove portion of a predetermined depth formed in the semiconductor substrate 10.

A guard ring line 13 is disposed in the guard ring region 4. The predetermined potential is supplied to the guard ring line 13 from the upper wiring layer (not shown) via a contact electrode CTg. The potential supplied from the upper wiring layer to the guard ring line 13 via the contact electrode CTg is supplied to the semiconductor substrate 10 in the first circuit region 2A via the semiconductor substrate 10. That is, by the guard ring region 4, it is possible to stabilize a well potential in which the transistors 11 are formed in the first circuit region 2A, and it is possible to prevent noise from the external circuit from being mixed and the well potential from becoming unstable.

FIG. 4 is a plan view illustrating a layout of the guard ring line 13 disposed in the guard ring region 4. FIG. 4 is a plan view in which a rectangular region B surrounded by a dotted line in FIG. 1 is cut out. In FIG. 4, all regions of the guard ring region 4 serve as the guard ring line 13. Here, crystal defects generated in the vicinity of a boundary between the semiconductor substrate 10 below the guard ring line 13 and the element isolation regions 12 will be described with reference to FIG. 4.

Figure 5:
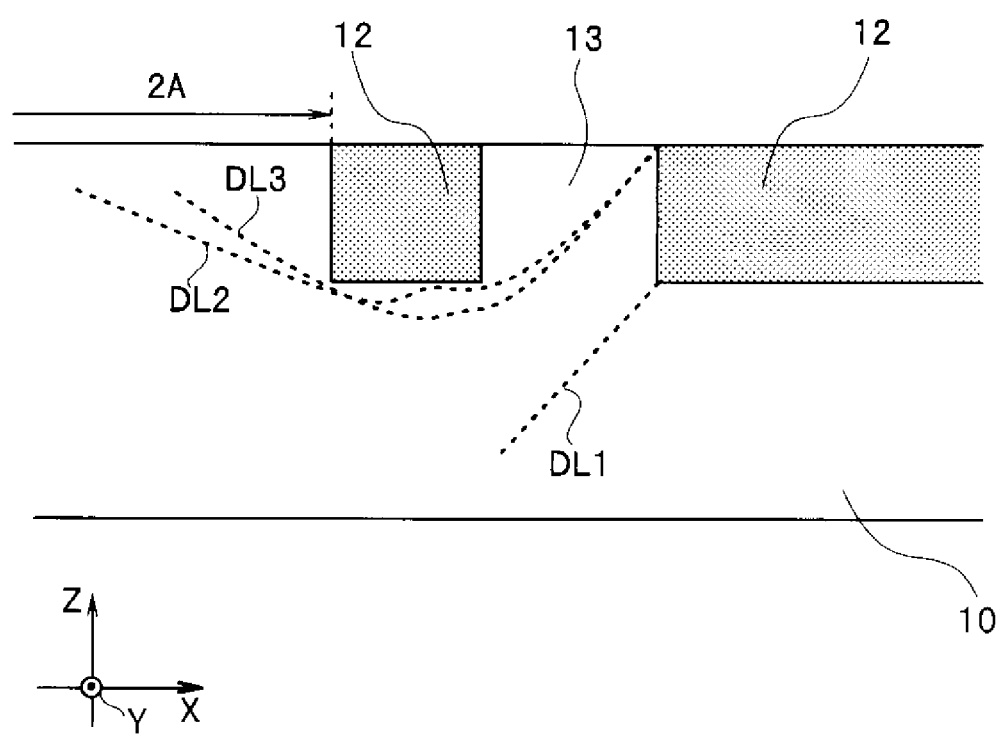
FIG. 5 is a cross-sectional view illustrating a dislocation extending to a semiconductor substrate.

FIG. 5 is a cross-sectional view illustrating a dislocation extending to the semiconductor substrate. FIG. 5 is a cross-sectional view taken along a line B1-B1' of the comparative example shown in FIG. 4. The element isolation region 12 is formed of silicon oxide, and the guard ring line 13 is formed of silicon. The silicon oxide film and the silicon have different thermal expansion coefficients. Therefore, in a step of forming various semiconductor circuits on the semiconductor substrate 10, when a heat treatment step (such as a film forming step using a thermal reaction at a high temperature such as a thermal oxide film formation or a thermal oxynitride film formation, an annealing treatment step for thermally diffusing impurities, which is performed after doping the impurities in the semiconductor substrate 10 by ion implantation) applied to the semiconductor substrate 10 is performed. The silicon oxide constituting the element isolation regions 12 is shrunk. The silicon constituting the guard ring line 13 is expanded.

When tensile stress is applied to surrounding silicon by the silicon oxide, distortion occurs in the guard ring line 13. When the distortion increases, the crystal defects are generated in a portion where the distortion occurs. A silicon crystal constituting the semiconductor substrate 10 has a "slip plane" of a {111} plane that is deformed depending on a crystal structure thereof. Then, dislocations DL1, DL2, and DL3 extend along the slip plane of the silicon from the generated crystal defects serving as a starting point.

For example, when the dislocation DL extends to the first circuit region 2A through the semiconductor substrate 10 of a lower layer of the element isolation regions 12 as the dislocations DL2 and DL3, for example, the dislocation DL2 serves as a current leakage source of the transistors 11 formed in the first circuit region 2A, and device failure may occur. Therefore, in order to improve reliability of the semiconductor storage device, it is necessary to prevent the extension of the dislocation DL to the first circuit region 2A.

As a method of preventing the extension of the dislocation DL, there is a method of stopping the extension before the dislocation DL reaches the first circuit region 2A. For example, a high distortion region in which high-concentration impurities are implanted is formed in the semiconductor substrate 10 of the lower layer of the element isolation region 12. By inducing the dislocation DL to the high distortion region, a method of preventing the dislocation DL from arriving at the first circuit region 2A corresponds to the method. However, an extension distance of the dislocation DL is proportional to a magnitude of the stress at the starting point, and when a large stress is applied at the starting point, the extension of the dislocation DL spreads not only in a downward direction (the Z direction) but also in a horizontal direction (the X direction or the Y direction) while changing the slip plane of the silicon. Therefore, it is difficult to induce and trap the dislocation DL in the high distortion region provided in the lower layer of the element isolation regions 12.

As another method of preventing the extension of the dislocation DL, there is a method of reducing the distortion generated in the guard ring line 13 and reducing the stress applied to a generation starting point of the dislocation DL. That is, the crystal defects are generated while the distortion generated in the guard ring line 13 is small, and the dislocation DL is extended. Accordingly, the distortion is reduced before a large distortion is accumulated in a subsequent wafer processing step, and the extension of the dislocation DL to a distant place is prevented.

Figure 6:
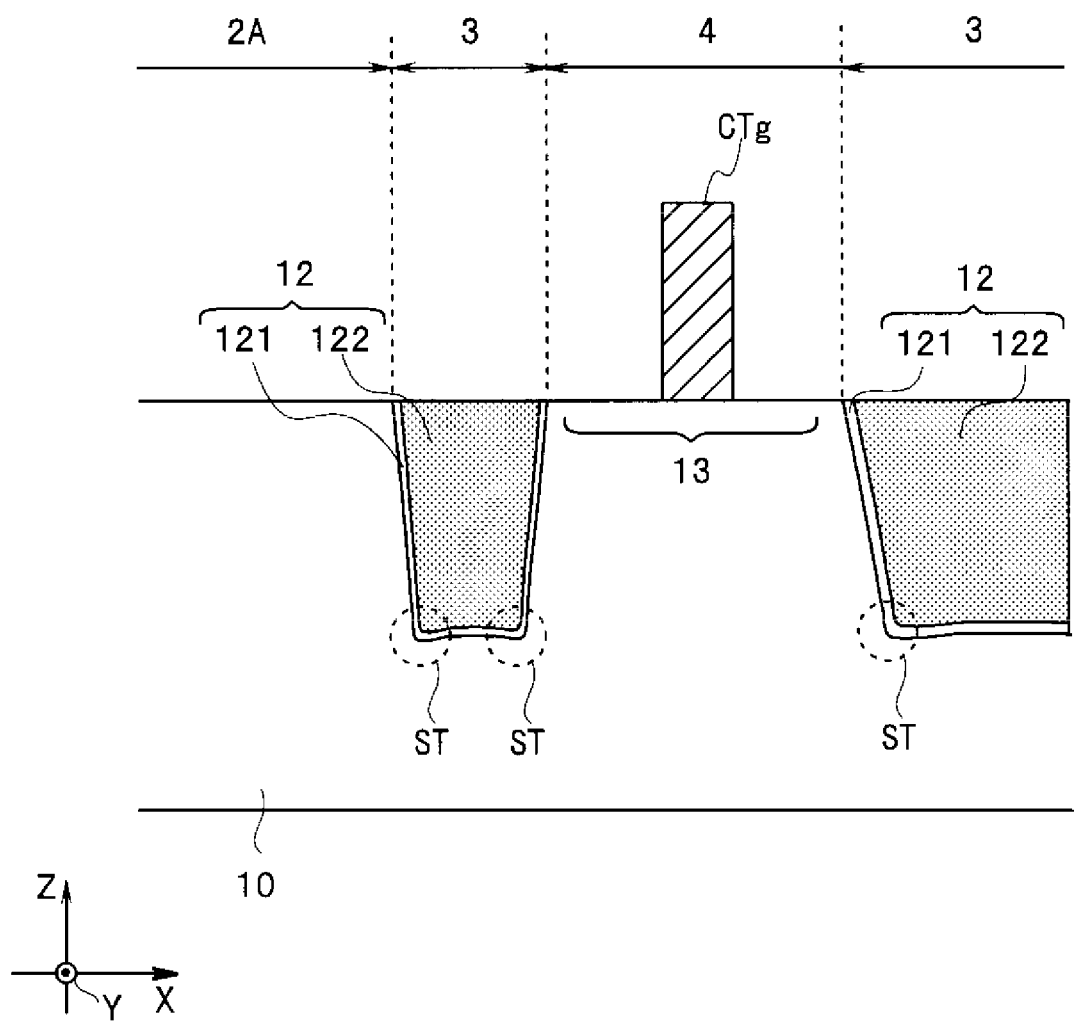
FIG. 6 is a cross-sectional view showing a configuration example of the semiconductor storage device according to the embodiment.

The crystal defects are selectively generated in places where the large distortion occurs locally. Therefore, when a place (stress concentration point) to which a stress larger than that in surroundings is applied is intentionally formed, the crystal defects can be generated in the place. Even when the dislocation DL extends to the first circuit region 2A, characteristics of the transistors 11 are not affected as long as the dislocation DL is in a deep layer. Therefore, the dislocation DL is preferably generated in the deep layer than in a surface layer. In FIG. 6, compared with the dislocations DL2 and DL3 generated from an upper end of the element isolation region 12, the dislocation DL1 generated from a lower end of the element isolation region 12 is less likely to cause the device failure even when the dislocation DL1 is extended to the first circuit region 2A.

In view of the above, in the semiconductor storage device 1 of at least one embodiment, the stress concentration point is actively formed at the lower end of the element isolation region 12, and while the distortion is small, the crystal defects are generated at the stress concentration point, and the dislocation DL is generated. Since the extension distance of the dislocation DL generated from the smaller distortion is shorter, it is possible to prevent the dislocation DL from extending toward the surface layer of a central portion of a circuit. As a result, the distortion generated in the guard ring line 13 is reduced, and the dislocation DL is prevented from extending to the surface layer of the first circuit region 2A.

FIG. 6 is a cross-sectional view showing a configuration example of the semiconductor storage device according to at least one embodiment. FIG. 6 is an enlarged view of the circuit isolation region 3 and the guard ring region 4 in the vicinity of the first circuit region 2A of the semiconductor storage device shown in FIG. 3. The semiconductor storage device 1 of at least one embodiment shown in FIG. 6 has a structure similar to the comparative example shown in FIG. 3 except for a structure of the element isolation regions 12. The element isolation region 12 of the semiconductor storage device 1 of at least one embodiment is composed of a silicon oxide film 122 and a thermal oxide film 121. Specifically, in order to form the element isolation region 12, the thermal oxide film 121 is formed on a surface of the semiconductor substrate 10, and the silicon oxide film 122 is formed on a surface of the thermal oxide film 121 along an inner wall of the groove portion (trench) formed by etching the semiconductor substrate 10. Further, sub-trenches STs are formed in bottom corner portions of the element isolation region 12.

Figure 7:
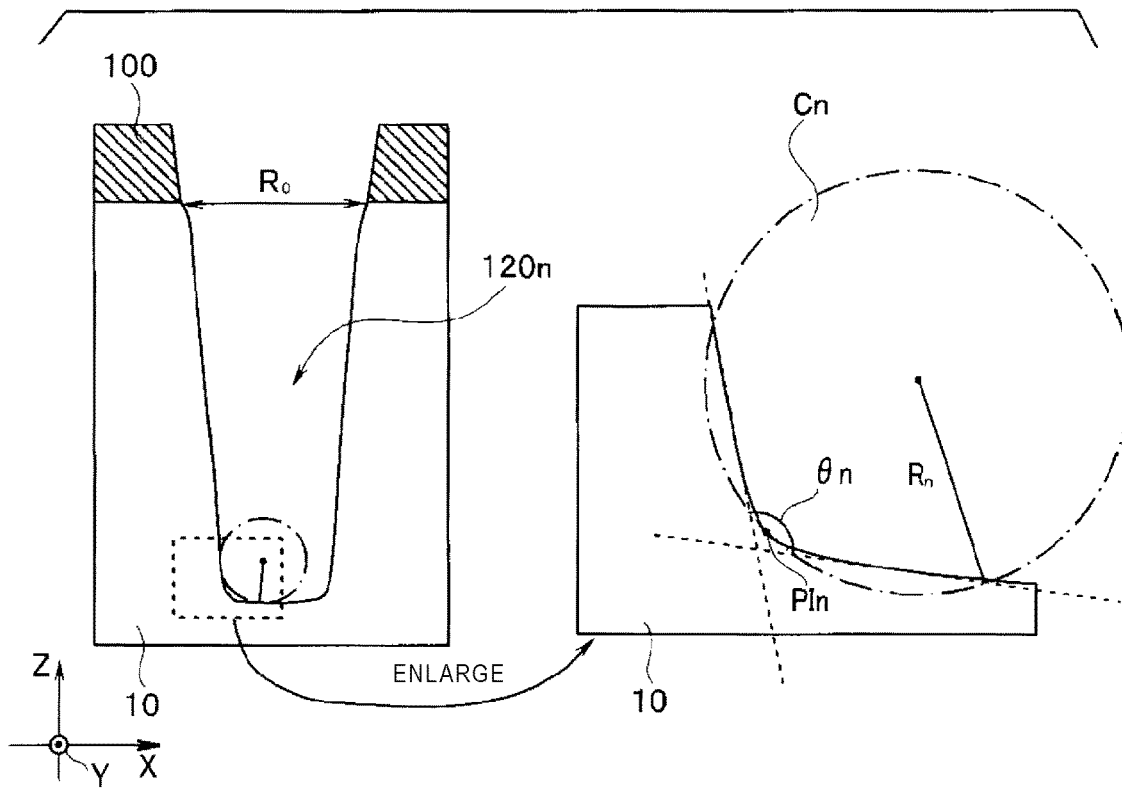
FIG. 7 is a schematic cross-sectional view illustrating a shape of a trench of the comparative example.
Figure 8:
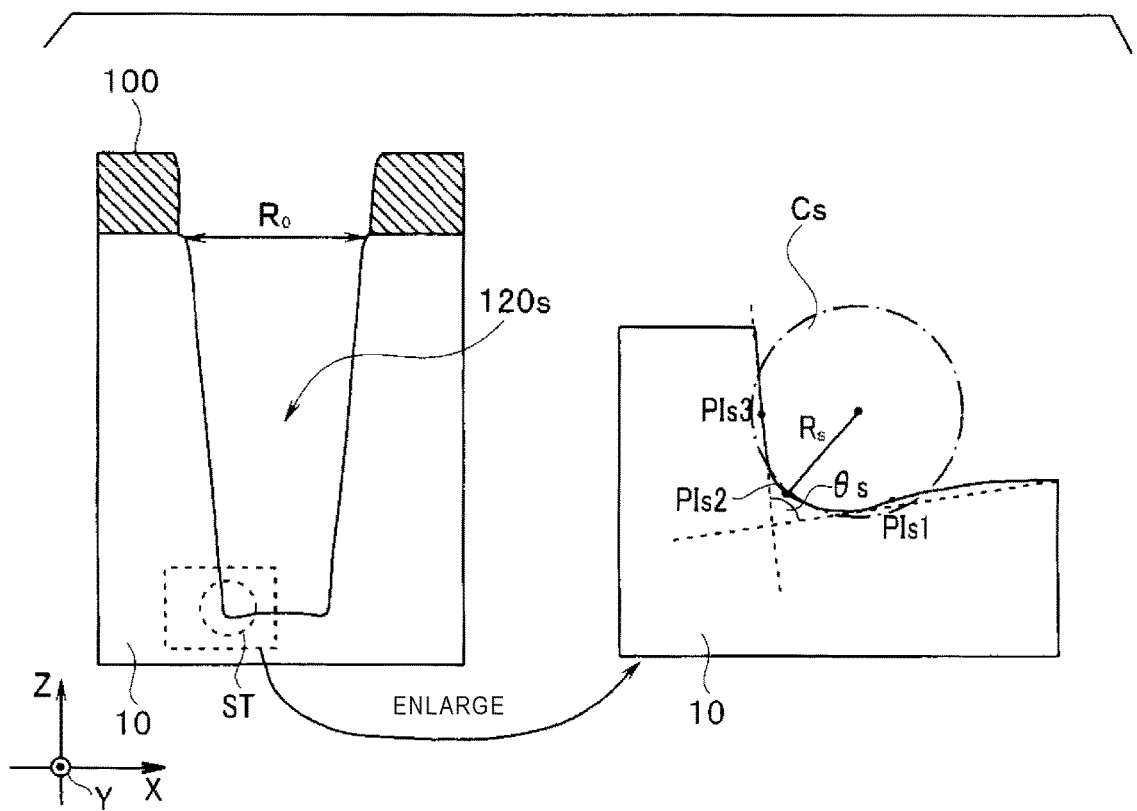
FIG. 8 is a schematic cross-sectional view illustrating a shape of a sub-trench.

Here, the sub-trench ST will be described with reference to FIGS. 7 and 8. FIG. 7 is a schematic cross-sectional view illustrating a shape of the trench without the sub-trench ST of the comparative example, and FIG. 8 is a schematic cross-sectional view illustrating a shape of the trench having the sub-trench ST. As shown in FIG. 7, an angle formed by a bottom surface and a side surface of a trench 120n without the sub-trench ST is an obtuse angle (an angle larger than a right angle). A curve representing an inner wall (the side surface and the bottom surface) of the trench 120n has one inflection point PIn at the bottom corner portion of the trench 120n.

On the other hand, as shown in FIG. 8, a shape of a trench 120s including the sub-trench ST has a shape in which a center of the bottom surface is high and the periphery is low, and a recessed portion is formed in the bottom corner portion. An angle formed by the bottom surface and the side surface of the trench 120s including the sub-trench ST is an acute angle (an angle smaller than the right angle). For example, the recessed portion in the bottom corner portion of the trench 120s functions as the sub-trench ST. Further, a curve representing an inner wall (the side surface and the bottom surface) of the trench 120s has three inflection points PIs1, PIs2, and PIs3 at the bottom corner portion of the trench 120s.

A radius of curvature Rs of a circle (inscribed circle in contact with the bottom surface and the side surface) in contact with the bottom corner portion (point PIs2 located at a tip end of the recessed portion of the sub-trench ST) of the trench 120s including the sub-trench ST formed in the semiconductor storage device 1 of the embodiment is smaller than a radius of curvature Rn of a circle in contact with the bottom corner portion (point PIn) of the trench 120n without the sub-trench ST in the comparative example shown in FIG. 7. Further, the radius of curvature Rs is, for example, half or less of a width Ro of an opening of the trench in the X direction. More preferably, the radius of curvature Rs is about ⅕ to 1/10 of the width Ro.

Figure 9:
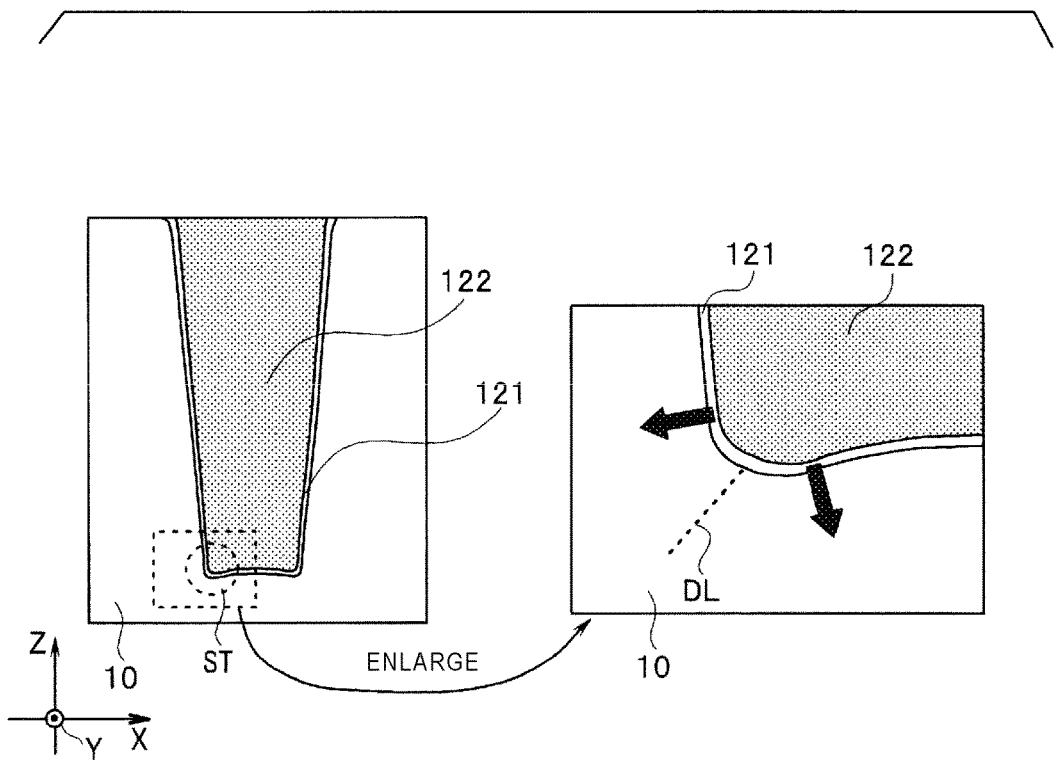
FIG. 9 is a diagram illustrating a stress applied to an element isolation region.

A reason for forming the thermal oxide film 121 on the inner wall of the trench 120s including the sub-trench ST as described above when the element isolation regions 12 are formed will be described with reference to FIG. 9. FIG. 9 is a diagram illustrating the stress applied to the element isolation region. As shown in FIG. 9, after the silicon oxide film 122 is directly embedded in the trench formed in the element isolation region 12 in the semiconductor substrate 10, the thermal oxide film 121 is formed between the semiconductor substrate 10 and the silicon oxide film 122 by performing high-temperature heating in an oxygen atmosphere. Specifically, the silicon present at an interface between the semiconductor substrate 10 and the silicon oxide film 122 is bonded to oxygen contained in a heating atmosphere to generate a silicon oxide, thereby forming the thermal oxide film 121. That is, the thermal oxide film 121 is formed while the silicon of the semiconductor substrate 10 is consumed. At this time, a volume of the silicon oxide to be generated is larger than that of the silicon to be consumed. A volume expansion in a thermal oxidation process applies a compressive stress to the semiconductor substrate 10. In particular, in the sub-trench ST having the acute angle (the angle smaller than the right angle), the volume expands in a constrained state, so that a large compressive stress is applied. Therefore, the crystal defects are generated in the sub-trench ST, which is the stress concentration point. According to at least one embodiment, by forming the thermal oxide film 121 on the inner wall of the trench of the element isolation region 12, while the distortion of the semiconductor substrate 10 is small, it is possible to intentionally generate the crystal defects at a stress concentration portion of the element isolation region 12 and to reduce the distortion.

Since the sub-trench ST serves as the stress concentration portion, the crystal defects can be selectively generated in the bottom corner portion of the element isolation region 12. The stress concentration point is actively formed at the lower end of the element isolation regions 12, and while the distortion is small, the crystal defects are generated at the stress concentration point, and the dislocation DL is generated. Since the extension distance of the dislocation DL generated from the smaller distortion is shorter, it is possible to prevent the dislocation DL from extending toward the surface layer of the central portion of the circuit. As a result, the distortion generated in the guard ring line 13 is reduced, and the dislocation DL is prevented from extending to the surface layer of the first circuit region 2A.

Figure 10:
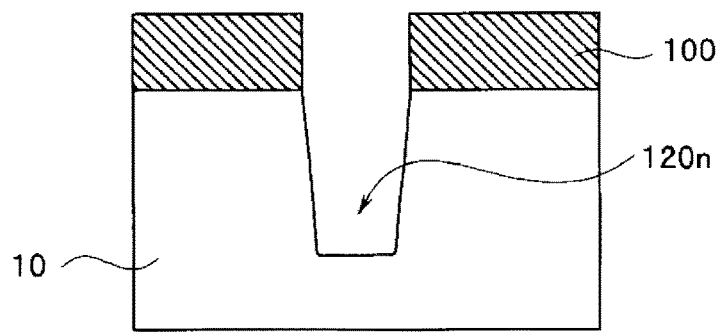
FIG. 10 is a cross-sectional view illustrating a step of forming an element isolation region of the comparative example.
Figure 11:
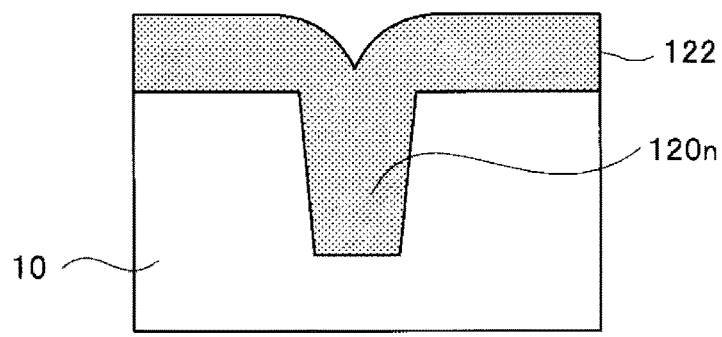
FIG. 11 is a cross-sectional view illustrating a step of forming the element isolation region of the comparative example.
Figure 12:
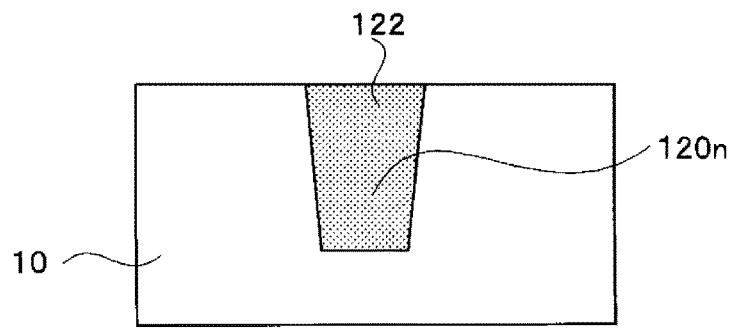
FIG. 12 is a cross-sectional view illustrating a step of forming the element isolation region of the comparative example.

Next, a method of forming the element isolation region 12 will be described with reference to the drawings. First, a method of forming the element isolation region 12 of the comparative example will be described with reference to FIGS. 10 to 12. FIGS. 10 to 12 are cross-sectional views illustrating steps of forming the element isolation region of the comparative example.

First, as shown in FIG. 10, an etching mask film (for example, a resist, an advanced patterning film (APF), or the like) 100 is formed on the surface of the semiconductor substrate 10, and the etching mask film 100 formed on an upper portion of the element isolation region 12 is removed. That is, the etching mask film 100 is patterned, and the surface of the semiconductor substrate 10 serving as the element isolation region 12 is exposed. Then, the semiconductor substrate 10 exposed from an opening of the etching mask film 100 is etched by anisotropic etching (for example, dry etching using a parallel plate type reactive ion etching (RIE) device using a mixed gas of SF6 and HBr), and the trench 120n is formed.

After the trench 120n is formed, the etching mask film 100 is entirely removed by asking or the like, and the surface of the semiconductor substrate 10 is exposed. Then, as shown in FIG. 11, the silicon oxide film 122 is deposited on an entire surface of the semiconductor substrate 10 by using a chemical vapor deposition (CVD) or the like. At this time, the silicon oxide film 122 is deposited to such a film thickness that the inside of the trench 120n is completely filled with the silicon oxide film 122.

Finally, using chemical mechanical polishing (CMP) or the like, the surface is flattened while removing the silicon oxide film 122 on the surface of the semiconductor substrate 10 other than the element separation region 12, and the formation of the element isolation region 12 of the comparative example is completed.

Next, a method of forming the element isolation region 12 of the embodiment will be described with reference to FIGS. 13 to 16. FIGS. 13 to 16 are cross-sectional views illustrating steps of forming the element isolation region of at least one embodiment.

Figure 13:
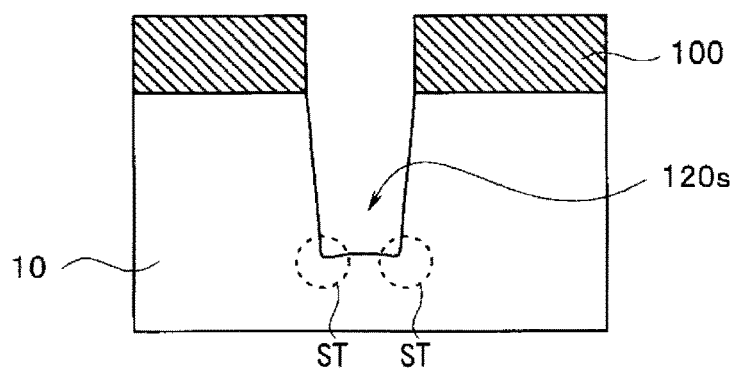
FIG. 13 is a cross-sectional view illustrating a step of forming the element isolation region of at least one embodiment.

First, as shown in FIG. 13, the etching mask film 100 is formed on the surface of the semiconductor substrate 10, and the etching mask film 100 formed on the upper portion of the element isolation region 12 is removed. That is, the etching mask film 100 is patterned, and the surface of the semiconductor substrate 10 serving as the element isolation region 12 is exposed. Then, the semiconductor substrate 10 exposed from the opening of the etching mask film 100 is etched by anisotropic etching, and the trench 120s is formed. At this time, the etching is performed under a condition that the sub-trenches STs are formed in the bottom corner portions of the trench 120s. For example, the trench 120s with the sub-trenches STs is formed by controlling a mixing ratio of a gas used for the etching (for example, the mixing ratio of the SF6 to the HBr), a pressure of the gas, and intensity of an RF power which is a high frequency power applied to the semiconductor substrate 10 to an appropriate value. If necessary, isotropic etching (for example, wet etching to be immersed in a mixed solution of HF and HNO3) may be performed after the anisotropic etching. By performing the isotropic etching as a post-process, a curvature of the sub-trench ST can be adjusted.

Figure 14:
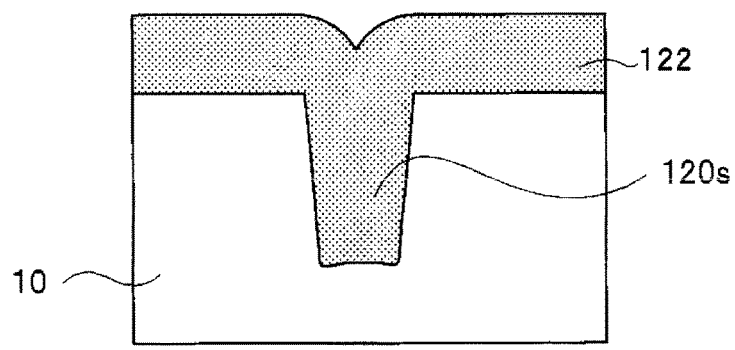
FIG. 14 is a cross-sectional view illustrating a step of forming the element isolation region of at least one embodiment.

After the trench 120s is formed, the etching mask film 100 is entirely removed by the asking or the like, and the surface of the semiconductor substrate 10 is exposed. Then, as shown in FIG. 14, the silicon oxide film 122 is deposited on the entire surface of the semiconductor substrate 10 by using the chemical vapor deposition (CVD) method or the like. At this time, the silicon oxide film 122 is deposited to such a film thickness that the inside of the trench 120n is completely filled with the silicon oxide film 122.

Figure 15:
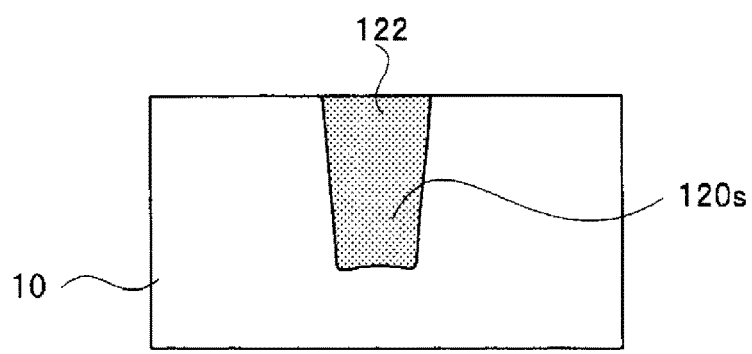
FIG. 15 is a cross-sectional view illustrating a step of forming the element isolation region of at least one embodiment.

Subsequently, as shown in FIG. 15, using the chemical mechanical polishing (CMP) or the like, the silicon oxide film 122 on the surface of the semiconductor substrate 10 other than the element isolation region 12 is removed, and the surface is flattened.

Figure 16:
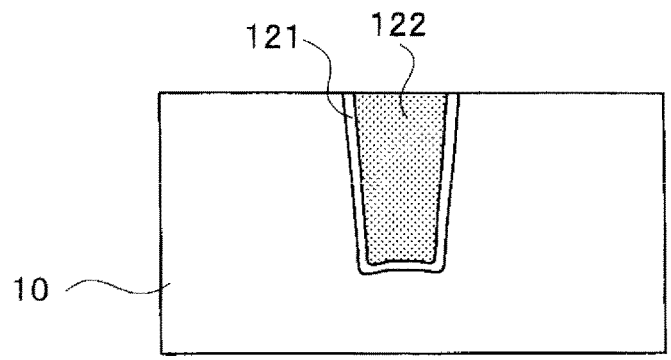
FIG. 16 is a cross-sectional view illustrating a step of forming the element isolation region of at least one embodiment.

Finally, as shown in FIG. 16, annealing treatment is performed for a certain period of time in the oxygen atmosphere, the thermal oxide film 121 is formed on side walls of the trench 120n, and the formation of the element isolation region 12 of the embodiment is completed.

As described above, according to at least one embodiment, the trench of the element isolation region 12 includes the sub-trenches STs at the bottom corner portions. Accordingly, since the sub-trench ST serves as the stress concentration portion, the crystal defects can be selectively generated in the bottom corner portion of the element isolation region 12 far from the surface layer of the circuit region. The element isolation region 12 has a two-layer structure of the thermal oxide film 121 and the silicon oxide film 122, and the thermal oxide film 121 is formed at the boundary with the semiconductor substrate 10. Accordingly, since the compressive stress is applied to the semiconductor substrate 10 from the thermal oxide film 121, while the distortion is small, the crystal defects can be generated at the stress concentration point and the dislocation DL can be generated. Since the extension distance of the dislocation DL generated from the smaller distortion is shorter, it is possible to prevent the dislocation DL from expanding toward the surface layer of the central portion of the circuit. As a result, the distortion generated in the guard ring line 13 can be reduced, and the dislocation DL can be prevented from extending to the surface layer of the first circuit region 2A.

Figure 17:
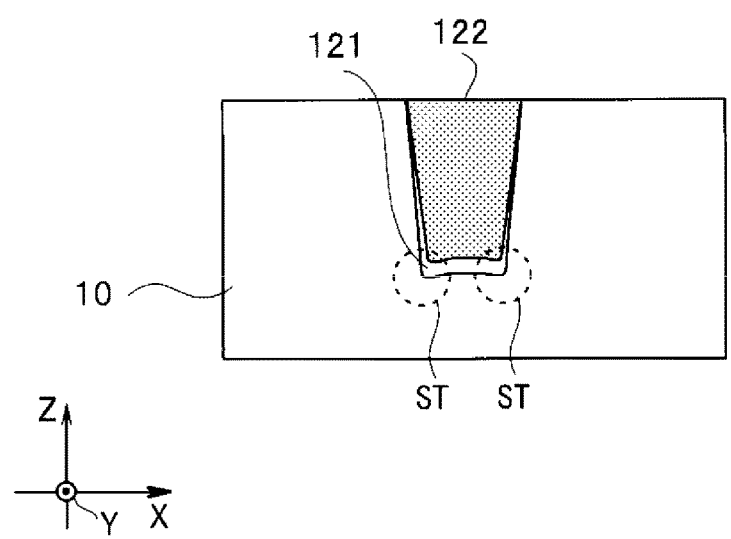
FIG. 17 is a cross-sectional view showing another example of the element isolation region of at least one embodiment.
Figure 18:
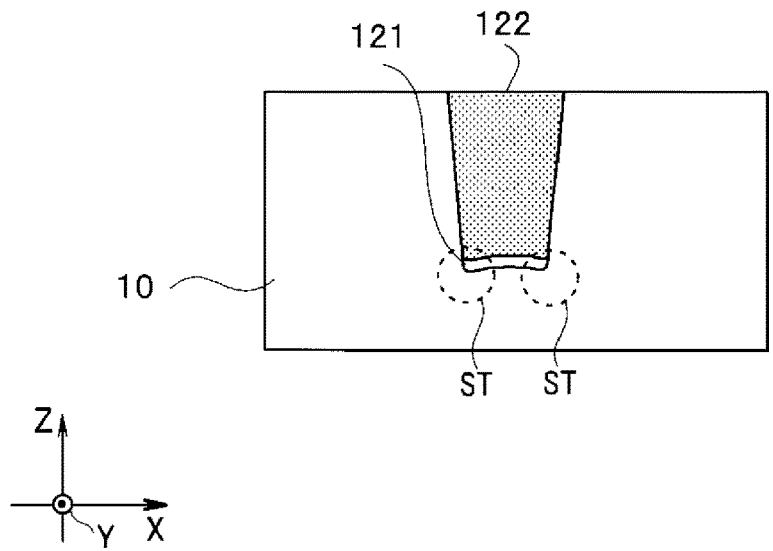
FIG. 18 is a cross-sectional view showing another example of the element isolation region of at least one embodiment.

FIGS. 17 and 18 are cross-sectional views illustrating another example of the element isolation region of the embodiment. The element isolation region 12 shown in FIG. 16 shows an example in which the thermal oxide film 121 is formed on entire side walls of the trench 120s with the same film thickness, but it is not always necessary to form the thermal oxide film 121 with a uniform film thickness. A desired compressive stress may be applied to the semiconductor substrate 10 by the thermal oxide film 121 covering the sub-trenches STs. Therefore, as shown in FIG. 17, the thermal oxide film 121 may be formed such that the film thickness of the thermal oxide film 121 increases toward a depth direction of the trench 120s. By making the film thickness of the thermal oxide film 121 of a portion (sub-trench ST) where the crystal defects are selectively generated thicker than that of the other portion, it is possible to expect an effect of further increasing probability of occurrence of the crystal defects at the bottom corner portion of the element isolation region 12. As shown in FIG. 18, the thermal oxide film 121 may be formed only on a bottom portion of the trench 120s including the sub-trenches STs. Although the compressive stress from the side walls cannot be obtained, the crystal defects can be generated in the bottom corner portion of the element isolation region 12 due to the compressive stress from the thermal oxide film 121 formed at the bottom portion.

The thermal oxide film 121 constituting the element isolation region 12 may be an insulating film made of a material capable of applying the compressive stress to the semiconductor substrate 10, and instead of the thermal oxide film 121, for example, the element isolation region 12 may be configured with another film such as a thermal nitride film. Further, the silicon oxide film 122 constituting the element isolation region 12 is not limited to the silicon oxide film formed by the CVD method. For example, a silicon oxide film formed by a formable method capable of filling a trench having a high aspect ratio, such as a high-density plasma oxide film formed by a plasma oxidation method, may be used.

The element isolation region 12 between the first circuit region 2A and the second circuit region 2B and a peripheral structure thereof are described above, and the element isolation region 12 between the first circuit region 2A and the third circuit region 2C and the peripheral structure thereof have the same configuration.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor storage device, comprising:
a semiconductor substrate;
a plurality of circuit regions formed in the semiconductor substrate; and an element isolation region formed between one of the plurality of circuit regions and another of the plurality of circuit regions, wherein the element isolation region has a trench shape that includes a sub-trench formed in a bottom corner portion of the element isolation region, the element isolation region includes a first insulating film and a second insulating film, the first insulating film covering at least an inner wall of the sub-trench, the sub-trench having a cross-section, a radius of curvature of the cross-section of the sub-trench at a tip end point of a recessed portion of the sub-trench is half or less of a width of an opening of the trench in a short-side direction of the trench.

2. The semiconductor storage device according to claim 1, wherein
a magnitude of a first stress applied from the first insulating film to the semiconductor substrate is larger than a magnitude of a second stress applied from the first insulating film to the second insulating film.

3. The semiconductor storage device according to claim 1, wherein
the first insulating film is a thermally-oxidized insulating film, and the second insulating film is a chemical vapor deposited insulating film.

4. The semiconductor storage device according to claim 3, wherein
the first insulating film and the second insulating film are silicon oxide films.

5. The semiconductor storage device according to claim 1, wherein
a NAND memory cell array is formed in at least one of the circuit regions.

6. The semiconductor storage device according to claim 1, wherein
a film thickness of the first insulating film is thicker at a deeper position of the trench than at a shallower position of the trench, in a depth direction perpendicular to a surface of the semiconductor substrate.

7. The semiconductor storage device according to claim 1, wherein the element isolation region includes shallow trench isolation.

8. The semiconductor storage device according to claim 1, further including at least one guard ring at least partially surrounding some of the plurality of circuit regions.

9. The semiconductor storage device according to claim 8, wherein the at least one guard ring is formed of silicon.

10. The semiconductor storage device according to claim 8, wherein the at least one guard ring has one of a rectangular shape or an angular-U shape.

11. The semiconductor storage device according to claim 8, wherein the at least one guard ring electrically disconnects adjacent of the plurality of circuit regions.

12. The semiconductor storage device according to claim 1, wherein the plurality of circuit regions include at least one of sense amplifiers, sequencers, or data registers.

13. The semiconductor storage device according to claim 1, wherein the first insulating film is annealed.

14. The semiconductor storage device according to claim 1, wherein the first insulating film has a varying thickness.

15. The semiconductor storage device according to claim 1, wherein the first insulating film is disposed only on a bottom of the trench.

16. The semiconductor storage device according to claim 1, wherein
the radius of curvature of the cross-section of sub-trench at the tip end point of the recessed portion of the sub-trench is between $1/5$ and $1/10$ of a width of the opening of the trench in the short-side direction of the trench.

17. The semiconductor storage device according to claim 1, wherein the circuit regions are free of crystal defects, and there are crystal defects around the sub-trench.

* * * * *